United States Patent
Capodieci

(10) Patent No.: US 7,354,682 B1
(45) Date of Patent: Apr. 8, 2008

(54) CHROMELESS MASK FOR CONTACT HOLES

(75) Inventor: Luigi Capodieci, Santa Cruz, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 578 days.

(21) Appl. No.: 10/887,640

(22) Filed: Jul. 9, 2004

(51) Int. Cl.
*G03F 1/00* (2006.01)
*G03F 1/14* (2006.01)

(52) U.S. Cl. ............................................. 430/5; 716/19
(58) Field of Classification Search ...................... 430/5
See application file for complete search history.

(56) References Cited

U.S. PATENT DOCUMENTS

| | | | |
|---|---|---|---|
| 5,273,850 A | 12/1993 | Lee et al. | |
| 5,487,962 A | 1/1996 | Rolfson | |
| 5,682,323 A * | 10/1997 | Pasch et al. | 716/19 |
| 5,932,377 A | 8/1999 | Ferguson et al. | |
| 6,057,066 A * | 5/2000 | Hanawa | 430/5 |
| 6,372,392 B1 * | 4/2002 | Hoshino et al. | 430/5 |
| 6,401,236 B1 * | 6/2002 | Baggenstoss et al. | 430/5 |
| 6,635,388 B1 | 10/2003 | Friedrich et al. | |
| 2003/0180629 A1 * | 9/2003 | Wu | 430/5 |
| 2005/0003284 A1 * | 1/2005 | Lu et al. | 430/5 |

OTHER PUBLICATIONS

Kasprowicz et al., "Application of Chromeless Phase Lithography (CPL) masks in ArF lithography," Unknown date.
Levenson et al., "The Vortex Mask: Making 80nm contacts with a twist!" Unknown date.

* cited by examiner

*Primary Examiner*—Mark F. Huff
*Assistant Examiner*—John Ruggles
(74) *Attorney, Agent, or Firm*—Renner, Otto, Boisselle & Sklar, LLP

(57) ABSTRACT

A chromeless phase-shift mask (CPM) for imaging sub-100 nm contact holes and a method of making the same are disclosed. The CPM includes a plurality of features formed on a substrate and a plurality of suppressors formed on the substrate. Light energy passing through the plurality of suppressors substantially reduces an interference generated by light energy passing through features within an optical proximity of each other, thereby significantly improving contrast and depth of focus. The plurality of features can be formed in a grid pattern, and the suppressors can be formed in adjacent corners of each feature. The size and location of the suppressors can be varied with respect to the features to obtain a desired image.

28 Claims, 9 Drawing Sheets

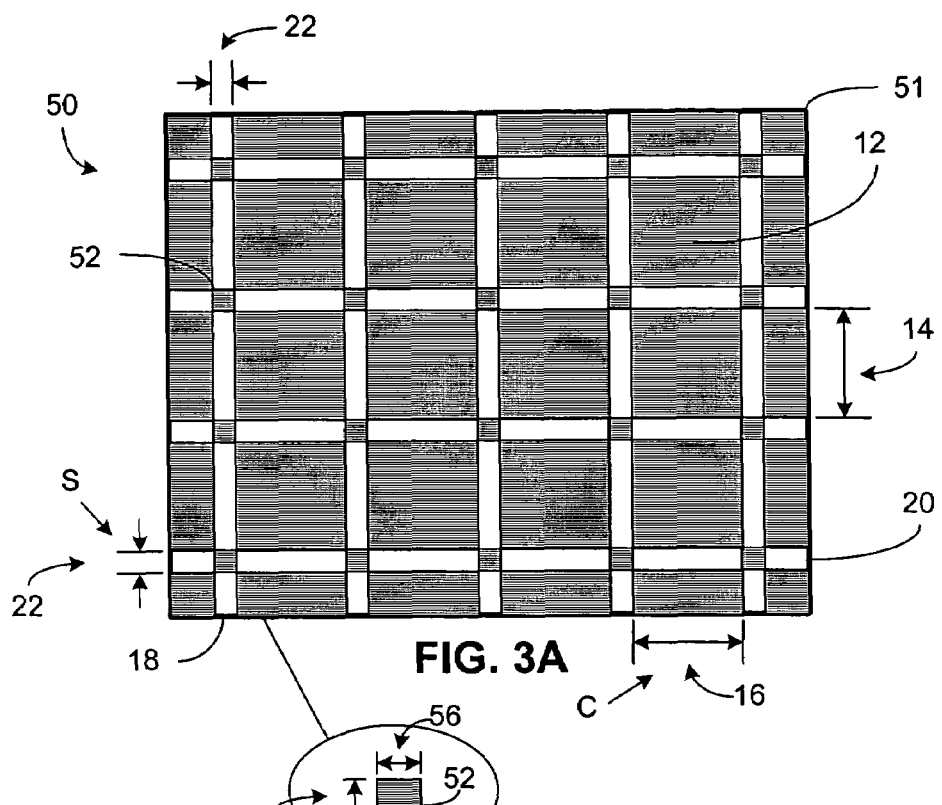
FIG. 3A
FIG. 3B
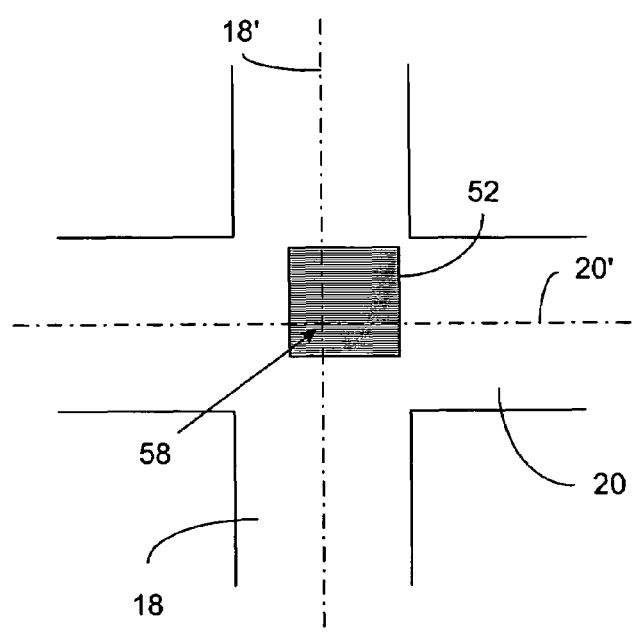
FIG. 3C section a-a section b-b

CHROMELESS MASK FOR CONTACT HOLES

TECHNICAL FIELD

The present invention relates generally to the field of integrated circuit manufacture and, more particularly, to a chromeless mask for patterning sub-100 nanometer contact holes.

BACKGROUND

In manufacturing semiconductor devices, small features or small geometric patterns are created by using optical photolithography. Typically, optical photolithography is achieved by projecting or by transmitting light through a pattern made of optically opaque areas and optically clear areas on a mask. The optically opaque areas of the pattern block the light, thereby casting shadows and creating dark areas, while the optically clear areas allow the light to pass, thereby creating light areas. Once the light areas and dark areas are formed, they are projected onto and through a lens and subsequently onto a photosensitive layer (e.g., resist) on a semiconductor wafer. Typically, the lens reduces the dimensions of the light and dark areas or pattern by a predetermined amount. Projecting light areas and dark areas on the resist results in portions of the resist being exposed, while other portions of the resist will be unexposed.

After exposure, the resist is developed to remove either the exposed portions of resist for a positive tone resist or the unexposed portions of resist for a negative tone resist. The patterned resist can then be used during a subsequent semiconductor fabrication process such as ion implantation or etching.

As microcircuit densities have increased, the size of the features of semiconductor devices have decreased to the sub-micron level. These sub-micron features may include the width and spacing of metal conducting lines or the size of various geometric features of active semiconductor devices. The requirement of sub-micron features in semiconductor manufacture has necessitated the development of improved lithographic processes and systems. One such improved lithographic process is known as phase-shift lithography.

With phase-shift lithography the interference of light energy is used to overcome diffraction and improve the resolution and depth of optical images projected onto a target. In phase-shift lithography, the phase of an exposure light at the object is controlled such that adjacent bright areas are formed preferably 180 degrees out of phase with one another. Dark regions are thus produced between the bright areas by destructive interference even when diffraction would otherwise cause these areas to be illuminated. This technique improves total resolution at the object.

In general, a phase-shifting photomask is constructed with a repetitive pattern formed of three distinct layers or areas. An opaque layer provides areas that allow no light transmission, a transparent layer provides areas which allow close to 100% of light to pass through, and a phase-shift layer provides areas which allow close to 100% of light to pass through but phase-shifted 180 degrees from the light passing through the transparent areas. The transparent areas and phase-shift areas are situated such that light energy diffracted through each area are canceled out in a darkened area therebetween. This creates the pattern of dark and bright areas which can be used to clearly delineate features of a pattern defined by the opaque layer of the mask on a photo patterned semiconductor wafer.

Another type of phase-shifting photo mask used in chromeless phase-shifting lithography (CPL) is known in the art as a chromeless phase-shifting mask (CPM). A CPM has no opaque (e.g., chrome) areas. Rather, the edges between the phase-shift areas and light transmission areas on the mask form a pattern of dark lines on the wafer. A CPM includes a transparent substrate with a raised or recessed phase-shifting area. The phase-shifting area may be formed by an additive or a subtractive process. The phase-shift can be created, for example, by etching a quartz substrate of the mask to a depth that is dependent on the wavelength of the imaging system.

Generally, with light being thought of as a wave, phase-shifting with a CPM is achieved by effecting a change in timing or by effecting a shift in waveform of a regular sinusoidal pattern of light waves that propagate through a transparent material. Typically, phase-shifting is achieved by passing light through areas of a transparent material of either differing thicknesses or through materials with different refractive indexes, thereby changing the phase or the period pattern of the light wave.

CPMs reduce diffraction effects by combining both phase-shifted light and non-phase-shifted light so that constructive and destructive interference takes place. Generally, a summation of constructive and destructive interference of phase-shift masks results in improved resolution and in improved depth of focus of a projected image of an optical system. Additionally, there is no need for a second exposure of a trim mask to remove unwanted phase edges, thereby simplifying the manufacturing process.

Referring to FIG. 1, a prior art CPM 10 for patterning contact holes is shown. The CPM 10 includes a repeating pattern of square shape features 12 formed on phase-shifted glass. The dimensions of the square shape features 12 are proportional to the dimensions of the contact holes to be patterned. The square shape features 12 have a length 14 and width 16, both of which are defined as having a dimension of "C". Separating each square shape feature 12 are vertical strips 18 and horizontal strips 20, each having a width 22, wherein the width has a dimension of "S". The vertical and horizontal strips 18, 20 define the boundaries of each square shape feature 12. Additionally, the vertical and horizontal strips form edges between phase-shift areas and light transmission areas on the CPM and, therefore, form a pattern of dark lines on a target device when exposed to light energy.

With additional reference to FIG. 2A, an exemplary image 30 obtained using the CPM 10 to expose a photosensitive layer to light energy is shown. The CPM 10 has a "C" dimension of about 160 nanometers (nm), an "S" dimension of about 40 nm, and a pitch of about 200 nm (i.e., the separation between center lines of adjacent contact holes). The image 30 formed in the photosensitive layer includes a pattern of contact holes 32, which, as noted above, are proportional to the length 14 and width 16 of the square shape features 12 on the CPM 10. Thus, the dimensions of the contact holes 32 can be varied by varying the length 14 and width 16 of the square shape pattern 12. The width of the vertical and horizontal strips 18, 20 determine the separation between adjacent contact holes.

As the length 14 and width 16 of each square shape pattern 12 and the width 22 of the strips 18, 20 decrease (i.e., "C" and "S" are decreased), the dimensions of each resulting contact hole image as well as the separation between adjacent contact hole images also decrease. As the values of "C" and/or "S" are reduced below a particular threshold, however, the contact pattern projected on the photosensitive layer becomes distorted or fails to image at all. This distortion is due to optical interference or lack thereof generated by light energy passing through adjacent square shape features 12. At larger feature sizes (e.g., "C" and "S" above a certain threshold), the interference is insignificant. As the feature size is reduced, however, the interference becomes significant and the pattern does not image as desired.

Referring to FIG. 2B, an image 40 is illustrated that was obtained using a CPM 10 with a "C" dimension of about 150 nm, an "S" dimension of about 50 nm, and a pitch of about 200 nm. The resulting image 40 includes contact hole patterns 32', along with dark spots 42 and intermediately bright spots 44. As should be appreciated, the dark spots 42 and the intermediately bright spots 44 are not desirable. FIG. 2C shows an image 40' obtained using a CPM 10 with a "C" dimension of 140 nm, an "S" dimension of 60 nm, and a pitch of 200 nm. In the second image 40' of FIG. 2C, the contact holes no longer image. Instead, an image is obtained that includes numerous dark spots 42' and bright spots 46 of varying dimensions. Again, the image 40' is not desirable.

Presently, chromeless phase-shift mask technology can accurately image patterns, such as contact holes, down to about 100 nm. A pervasive trend in modern integrated circuit manufacture is to produce semiconductor devices that are as small as possible. As this trend continues, CPM technology will soon reach a limitation where it can no longer pattern images required for modern integrated circuits.

Accordingly, there is a need in the art for a device and method of patterning sub-100 nm contact holes using CPL.

SUMMARY OF THE INVENTION

According to one aspect of the invention, the invention is directed to a method of forming a chromeless phase-shift mask (CPM) for imaging sub-100 nanometer (nm) features. The method includes the steps of: forming a plurality of features on a substrate; and forming a plurality of suppressors on a substrate, wherein when the CPM is exposed to light energy, the suppressors substantially reduce an interference generated between adjacent features.

Another aspect of the invention is directed to a chromeless phase-shift mask (CPM) for forming sub-100 nanometer (nm) features on a target surface. The CPM includes: a substrate; a plurality of features formed on the substrate; and a plurality of suppressors formed on the substrate, wherein when the CPM is exposed to light energy, the suppressors substantially reduce an interference generated between adjacent features.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

These and further features of the present invention will be apparent with reference to the following description and drawings, wherein:

FIG. 3A illustrates a portion of a chromeless phase-shift mask in accordance with an embodiment of the present invention;

FIG. 3B illustrates an enlarged view of the side lobe suppressors of the CPM of FIG. 3A;

FIG. 3C illustrates an enlarged view of the side lobe suppressors of the CPM of FIG. 3A in accordance with another embodiment of the invention;

DISCLOSURE OF THE INVENTION

Figure 1:
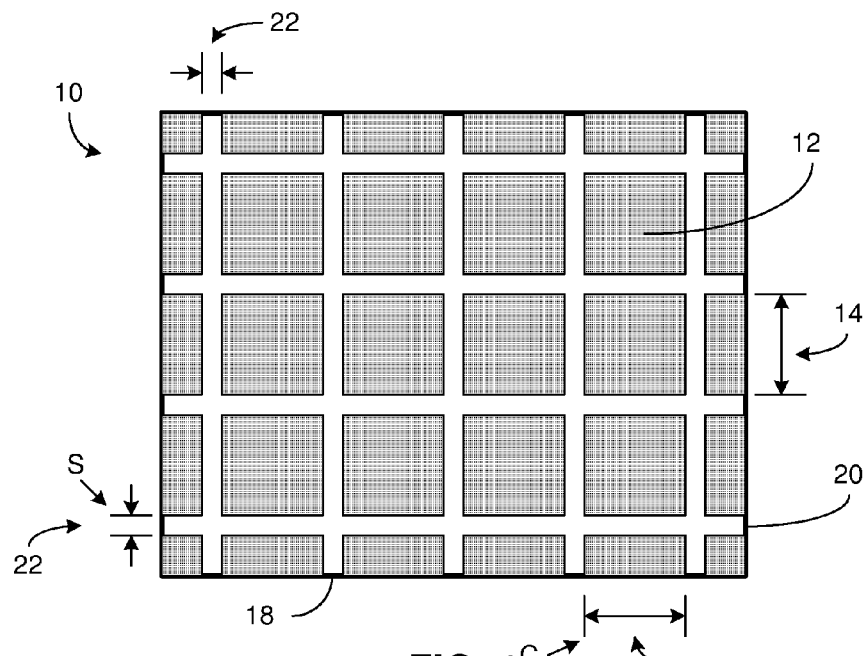
FIG. 1 illustrates a portion of a prior art chromeless phase-shift mask used for imaging contact holes on a target device.
Figure 2A:
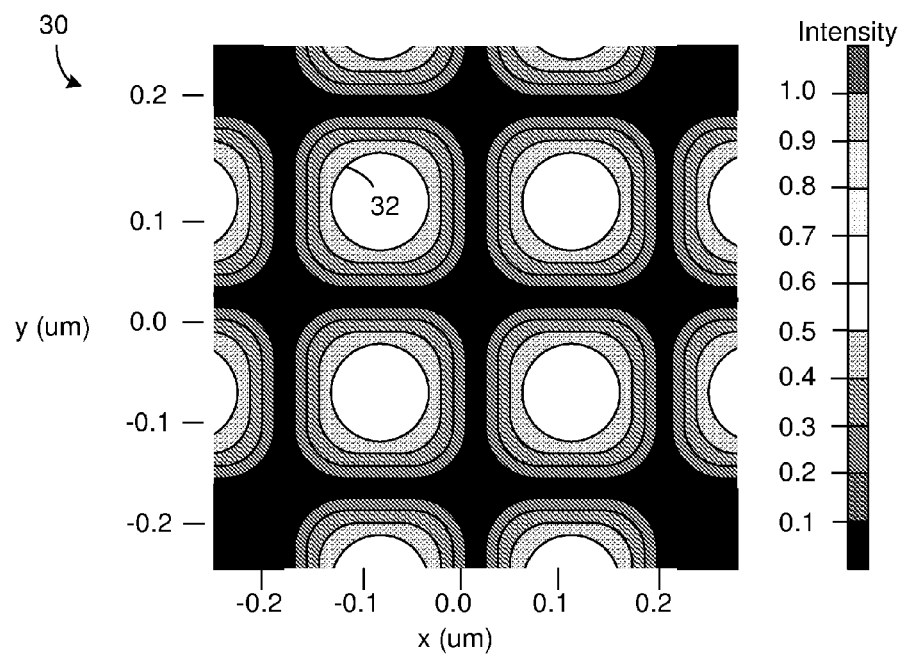
FIG. 2A illustrates a portion of a contact hole pattern imaged in a photosensitive layer using the chromeless phase-shift mask of FIG. 1, wherein the contact hole diameter is greater than 100 nanometers (nm)
Figure 2B:
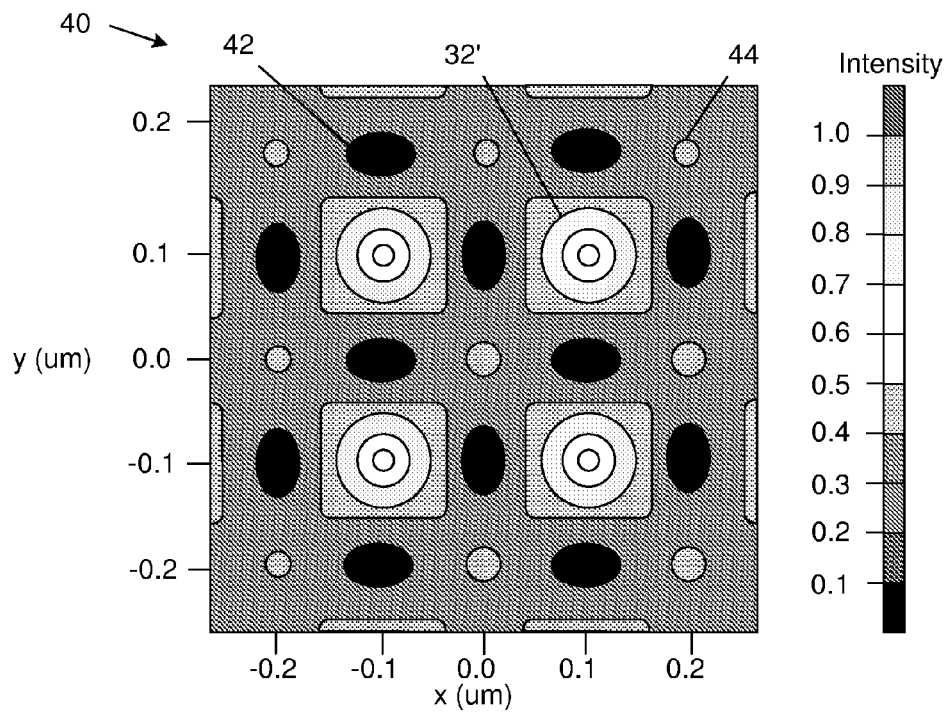
FIG. 2B illustrates a portion of a pattern obtained using the chromeless phase-shift mask of FIG. 1 as the features of the chromeless phase-shift mask are reduced in an attempt to obtain contact hole images of about 100 nm.
Figure 2C:
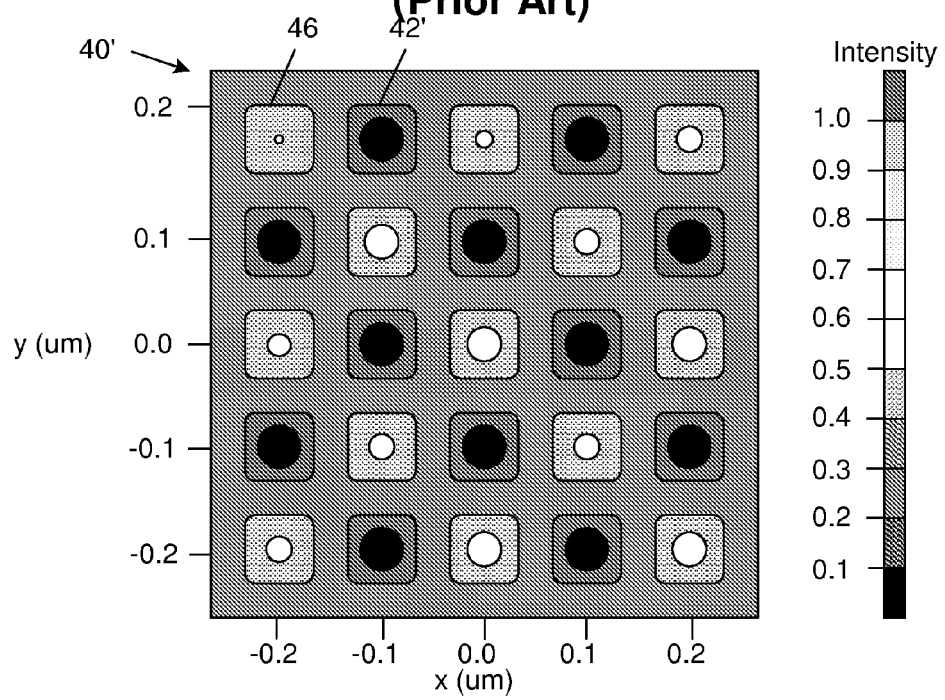
FIG. 2C illustrates a portion of a pattern obtained using the chromeless phase-shift mask of FIG. 1 as the features of the chromeless phase-shift mask are further reduced in an attempt to obtain contact hole images less than 100 nm.

In the detailed description that follows, corresponding components have been given the same reference numerals, regardless of whether they are shown in different embodiments of the present invention or at difference times during a wafer processing method. To illustrate the present invention in a clear and concise manner, the drawings may not necessarily be to scale.

The description herein is presented in the exemplary context of fabricating a contact hole on a wafer having an integrated circuit (IC) formed thereon. Example ICs include general purpose microprocessors made from thousands or millions of transistors, a flash memory array or any other dedicated circuitry. One skilled in the art will appreciate that the methods and devices described herein can also be applied to the fabrication of any article manufactured using lithography, such as micromachines, disk drive heads, gene chips, micro electro-mechanical systems (MEMS) and so forth.

The present invention relates to imaging small features, such as contact holes, thereby extending the process window for current and future manufacturing technologies. As will be described in more detail below, a chromeless phase-shift mask (CPM) is used to image contact holes on a target device. Moreover, the CPM of the present invention is used to image sub-100 nm contact holes with good contrast and depth of focus. The CPM includes main features having dimensions proportional to the holes to be patterned. Additionally, the CPM includes side lobe suppressors, which can have varying sizes depending on the proximity context of the array of contacts.

Referring first to FIG. 3A, a CPM 50 in accordance with an embodiment of the present invention is illustrated. The CPM 50 is formed on a glass substrate 51, such as quartz, for example, and includes a repeating pattern of square shape features 12 formed on phase-shifted glass. The dimensions of the square shape features 12 are proportional to the dimensions of the contact holes to be patterned and have a length 14 and width 16, both of which are defined as having a dimension "C". As will be appreciated, however, the length 14 can be different from the width 16 depending on the pattern to be imaged. For example, if oval shape contacts are desired, the length 14 can be dimensioned to be greater than or less than the width 16. Additionally, features having a shape other than a square/rectangular shape are contemplated by the present invention. For example, additional decoration may be added for optical proximity correction.

Separating each square shape feature 12 are vertical strips 18 and horizontal strips 20, each having a width 22, wherein the width 22 has a dimension "S". The vertical and horizontal strips 18, 20, which are formed in non-phase-shifted glass, define the boundaries of each square shape feature 12. Additionally, the vertical and horizontal strips form edges between phase-shift areas and light transmission areas on the CPM and, therefore, form a pattern of dark lines on a target device when exposed to light energy. It is noted that while the exemplary embodiment is illustrated with vertical and horizontal strips 18, 20 having substantially the same widths, the present invention contemplates horizontal and vertical strips have differing widths. For example, the requirements of a particular circuit may dictate that the horizontal spacing be less than the vertical spacing.

Additionally, the CPM 50 includes side lobe suppressors 52. The side lobe suppressors 52 are placed on or near the intersections of the vertical strips 18 and horizontal strips 20 of the CPM 50. In other words, the side lobe suppressors 52 are formed along and/or between the corners of each square shape feature 12. The side lobe suppressors are formed in phase-shifted glass having a different phase or period pattern than the phase-shifted glass used for the square shape features 12. Thus, light energy passing through the side lobe suppressors 52 is phase-shifted with respect to the light energy passing through the square shape features 12. The phase-shifted light energy created by the side lobe suppressors 52 substantially reduces and/or cancels interference created by light energy passing through features within the optical diameter or within optical proximity of the patterned feature. The reduction in interference permits printing of a sub-100 nm contact holes with good resolution and depth of focus.

Generally, a two-way phase shift or a three-way phase shift is implemented. In a two-way phase shift, the phase-shift introduced to light energy passing through each square shape feature 12 is about 180 degrees with respect to light energy passing through non-phase-shifted glass (e.g., through the vertical and horizontal strips 18, 20). In some instances, a 90 degree phase shift can be used, depending on the amount of light intensity that is to be suppressed. In a three-way phase shift, the phase-shift introduced to light energy passing through each square shape feature 12 can be 60, 120 or 180 degrees with respect to light energy passing through non-phase-shifted glass. It is preferable that light energy passing through each square shape feature 12 be phase-shifted between about 60 degrees to about 180 degrees with respect to light energy passing through the side lobe suppressors 52.

With further reference to FIG. 3B, the side lobe suppressors 52 can have a length 54 and/or a width 56 greater than "S", equal to "S", or less than "S". The relationship between the dimensions "C" and "S" and the dimensions 54, 56 of the side lobe suppressors is dependent on the wavelength of light used to image the contact holes, as well as the desired dimensions of the imaged contact hole. Therefore, the dimensions of the side lobe suppressors are optimized for the dimension of the final contact hole to be printed and the particular wavelength of light used to print the contact hole. Also, while the side lobe suppressors 52 are shown having a square shape, they may be formed having a rectangular shape.

Additionally, the side lobe suppressors 52 can be offset with respect to an intersection of the vertical and horizontal strips 18, 20. Referring briefly to FIG. 3C, a center point 58 created by the intersection of a vertical centerline 18' of the vertical strip 18 and a horizontal centerline 20' of the horizontal strip 20 is shown. The side lobe suppressor 52 is formed above and to the right of the center point 58. The actual position or offset of the side lobe suppressors is contingent upon the design intent. As will be appreciated, the side lobe suppressors can be formed above or below the horizontal centerline 20' and to the left or to the right of the vertical centerline 18' for each intersection of the vertical and horizontal strips 18, 20. In one embodiment, all the side lobe suppressors 52 are offset from the central intersection 58 by an equal amount.

Figure 4A:
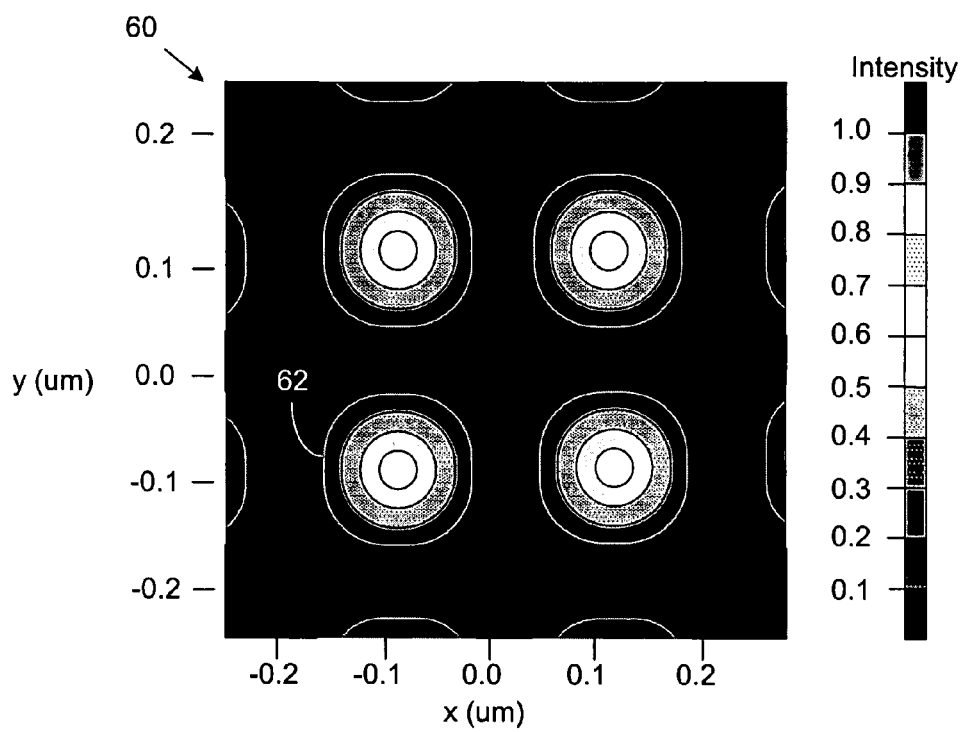
FIG. 4A illustrates a portion of a contact hole pattern imaged in a photosensitive layer using the chromeless phase-shift mask of FIG. 3A, wherein the features of the chromeless phase-shift mask are dimensioned to image contact holes that are about 100 nm in diameter.

With additional reference to FIG. 4A, an exemplary image 60 obtained using the CPM 50 to expose a photosensitive layer to light energy is shown. The CPM 50 has a dimension "C" of about 150 nanometers (nm), a dimension "S" of about 50 nm, and a pitch of about 200 nm. The image 60 formed in the photosensitive layer includes a pattern of contact holes 62, which, as noted above, are proportional to the length 14 and width 16 of the square shape features 12 on the CPM 50. As can be seen in FIG. 4A, the pattern of contact holes 62 is clearly defined, and each contact hole has a diameter of about 100 nm.

Figure 4B:
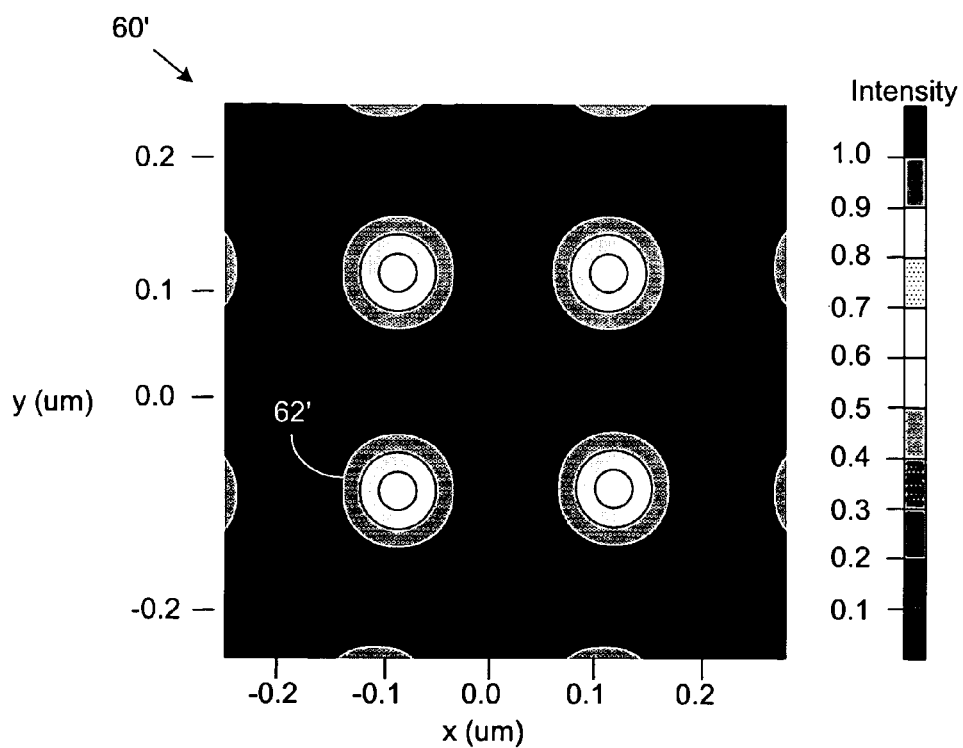
FIG. 4B illustrates a portion of a contact hole pattern imaged in a photosensitive layer using the chromeless phase-shift mask of FIG. 3A, wherein the imaged contact holes are less than 100 nm in diameter.

FIG. 4B illustrates a second exemplary image 60' obtained using the CPM 50 of the present invention to expose a photosensitive layer to light energy. The CPM 50 used to obtain the image 60' has a dimension "C" of about 140 nm, a dimension "S" of about 60 nm, and a pitch of about 200 nm. As can be seen in the image 60', the contact holes 62' are less than 100 nm in diameter. Again, the pattern of contact holes 62' are clearly defined, even at the sub-100 nm level.

Figure 5:
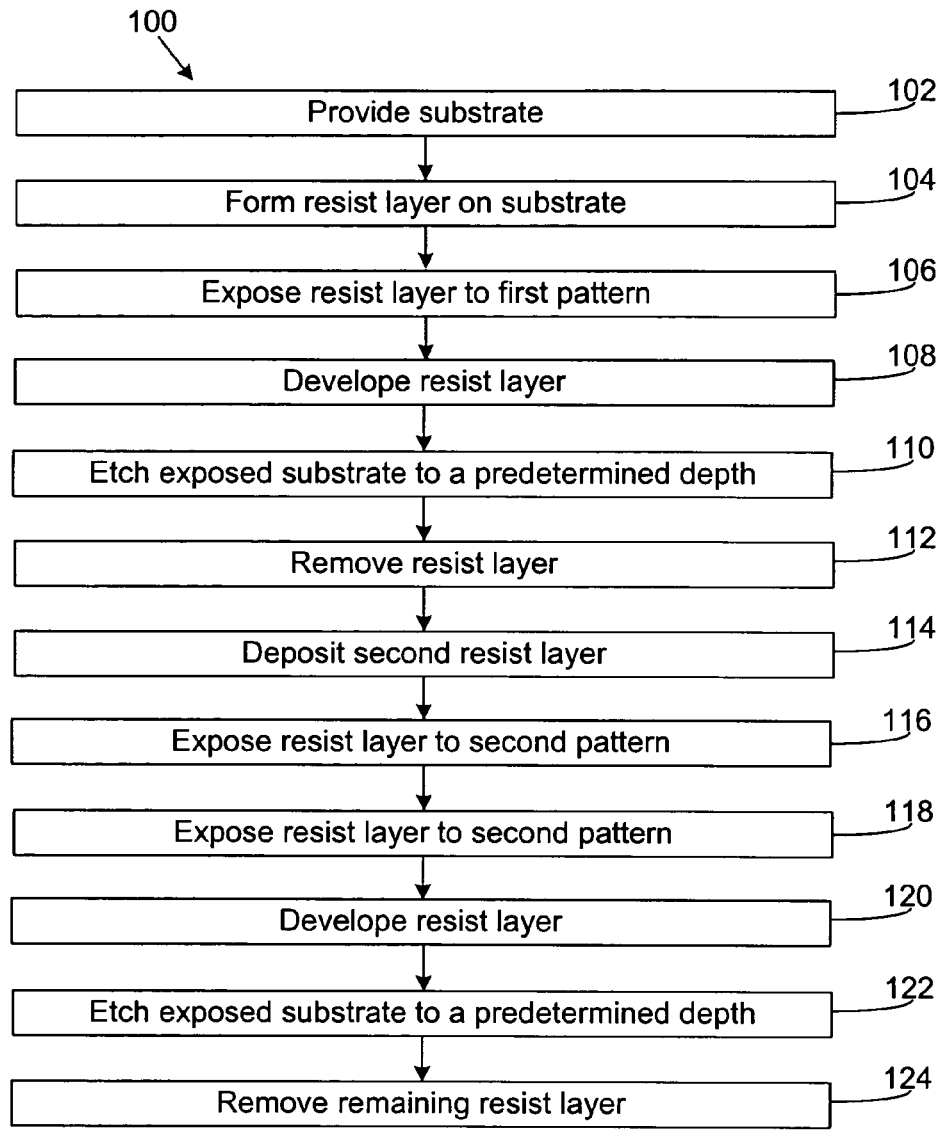
FIG. 5 is a flow chart illustrating a method of fabricating a chromeless phase-shift mask in accordance with an embodiment of the invention.

Referring now to the flowchart 100 of FIG. 5 in conjunction with the diagrams of FIG. 6A-FIG. 6J, exemplary processing steps for fabricating the mask 50 in accordance with an embodiment of the present invention are shown. The process can be thought of as depicting steps in a method. The flow diagram includes a number of process blocks arranged in a particular order. As should be appreciated, many alternatives and equivalents to the illustrated process may exist and such alternatives and equivalents are intended to fall with the scope of the claims appended hereto. Alternatives may involve carrying out additional steps or actions not specifically recited and/or shown, carrying out steps or actions in a different order from that recited and/or shown, and/or omitting recited and/or shown steps. Alternatives also include carrying out steps or actions concurrently or with partial concurrence.

Beginning at step 102, a transparent substrate 51, such as a quartz substrate, is provided. It should be appreciated that while a quartz substrate is used in the exemplary embodiment, alternate substrates may be formed of other transparent materials having suitable optical and mechanical properties. At step 104, a resist layer 202 is deposited over the substrate 51 using conventional techniques. The type of resist used is dependent on the beam writer's exposure wavelength. For example, electron-beam generation usually requires e-beam sensitive resists, e.g., polybutene-1-sulfone (PBS), while resists for optical beam writers include ARCH 895i and TOK iP3500.

Figure 6A:
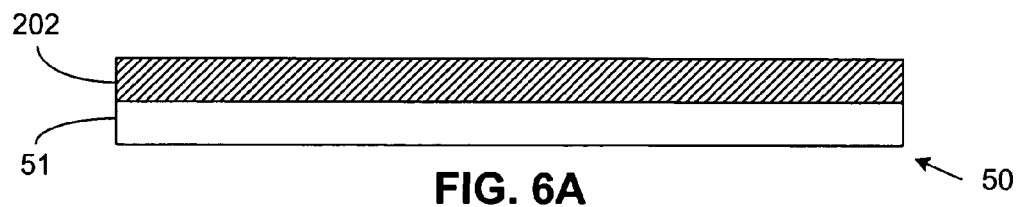
FIG. 6A is a cross section of the mask and pattern described in the flow chart of FIG. 5 in an intermediate stage of fabrication.
Figure 6B:
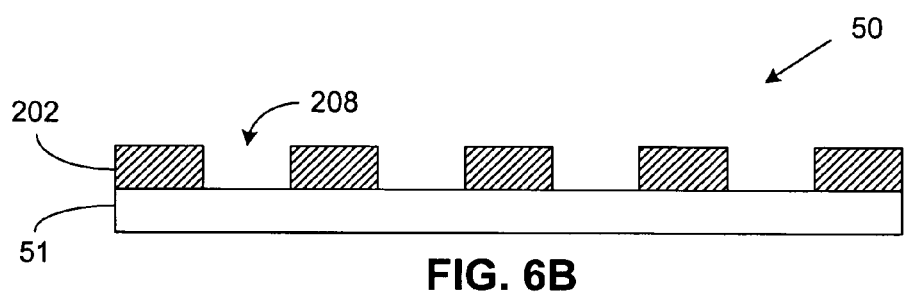
FIG. 6B is a cross section of the mask and pattern described in the flow chart of FIG. 5 in an intermediate stage of fabrication.

Moving to step 106, the resist layer 202 is exposed to a first pattern, such as, for example, a square shape pattern having the square shape features 12 of FIG. 3A. Mask patterning is accomplished primarily by means of beam writers (not shown), such as the aforementioned electron beam writers and optical beam writers, for example. Exposure of the resist layer 202 depends on the type of resist employed, e.g., a positive tone resist or a negative tone resist. For a positive tone resist, a portion of the resist layer 202 is exposed that will form the square shape features 12, while a portion of the resist layer 202 that will form the vertical and horizontal strips 18, 20 is not exposed. After exposure, the resist layer 202 is developed at step 108, which exposes portions 208 of the substrate 51 as shown in FIG. 6B.

Figure 6C:
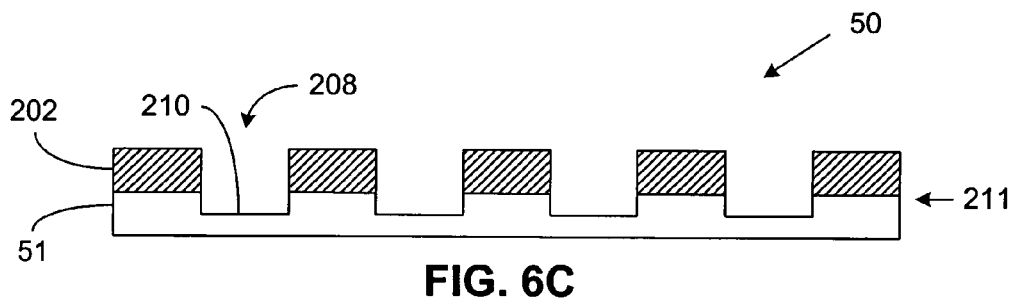
FIG. 6C is a cross section of the mask and pattern described in the flow chart of FIG. 5 in an intermediate stage of fabrication.
Figure 6D:
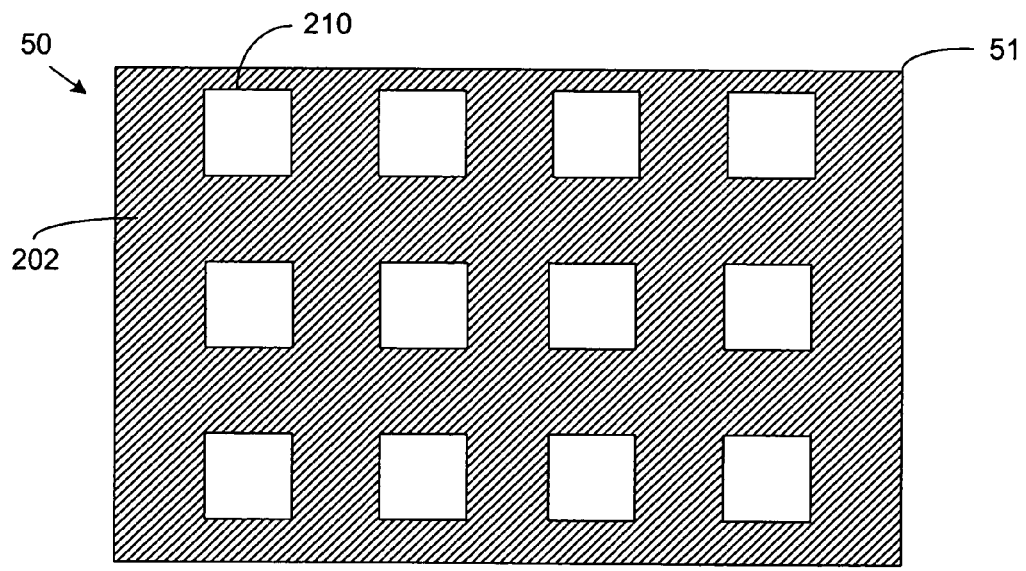
FIG. 6D is a top view of a portion of the mask of FIG. 6C.
Figure 6E:
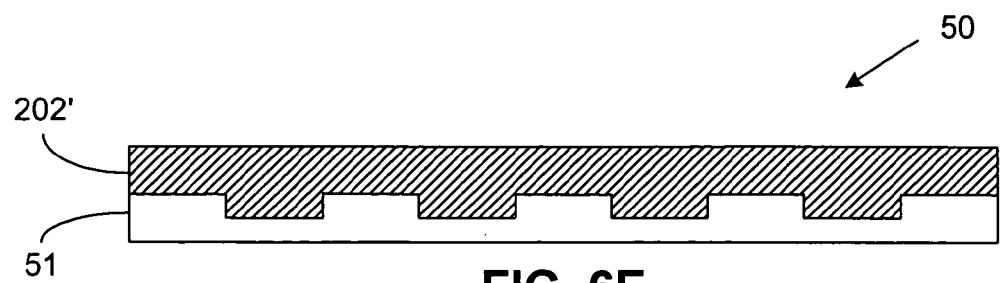
FIG. 6E is a cross section of the mask and pattern described in the flow chart of FIG. 5 in an intermediate stage of fabrication.

Moving to step 110, the exposed portions 208 of the substrate 51 are etched, thereby forming a first set of trenches 210 in the substrate, as can be seen in FIGS. 6C and 6D. The etch depth into the substrate is a strong function of the wavelength of light used to image the contact hole, as well as the composition of the substrate. For example, a quartz substrate intended for use with a 248 nm laser would require an etch depth (measured from a surface 211 of the substrate 51) of about 1240 angstroms. In a quartz substrate, this depth will phase shift the 248 nm laser light energy about 179 degrees to about 181 degrees with respect to the same light energy passing through an unmodified portion of the substrate. The substrate can be etched, for example, using a fluorine based etchant such as $SF_6$, $CF_4$ or $CHF_3$. In one embodiment, each trench 210 forms an image of a contact hole in the photosensitive layer when the CPM 50 is used to pattern an image on a photosensitive layer.

Figure 6F:
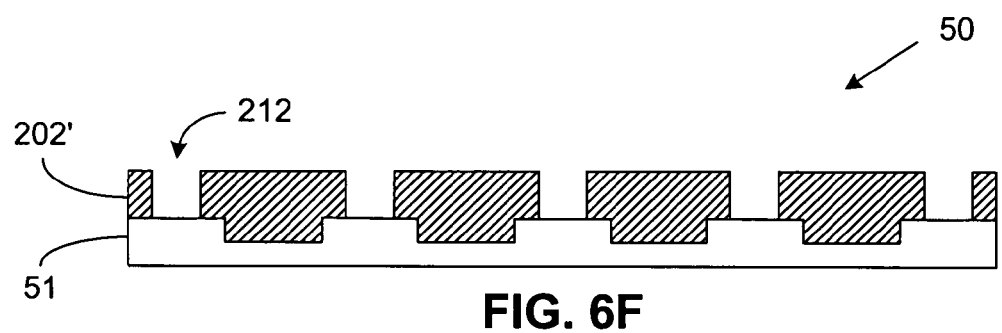
FIG. 6F is a cross section of the mask and pattern described in the flow chart of FIG. 5 in an intermediate stage of fabrication.

Next at step 112, the resist layer 202 is removed from the substrate 51 using conventional techniques and, at step 114, a second resist layer 202' is deposited over the substrate 51. Moving to step 116, the optical beam writer (not shown) is used to expose the second resist layer 202' to a second pattern. The second pattern forms an image of the side lobe suppressors 52 in the second resist layer 202'. The image of the side lobe suppressors is formed in adjacent corners of each trench 210 formed on the substrate, as is shown in more detail in FIG. 6H. After exposure, the resist layer 202' is developed at step 118, which exposes portions 212 of the substrate 51 as shown in FIG. 6F.

Figure 6G:
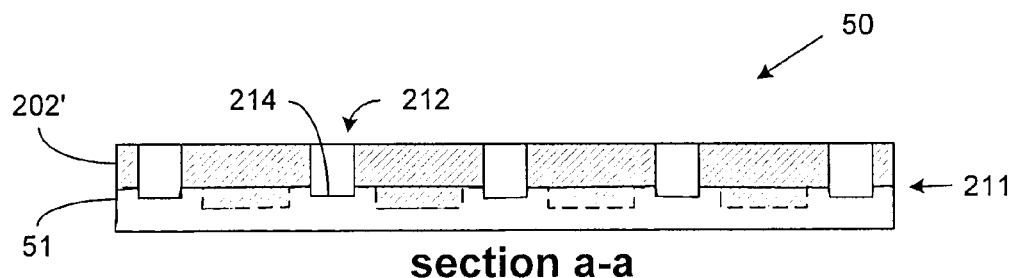
FIG. 6G is a cross section of the mask and pattern described in the flow chart of FIG. 5 in an intermediate stage of fabrication.
Figure 6H:
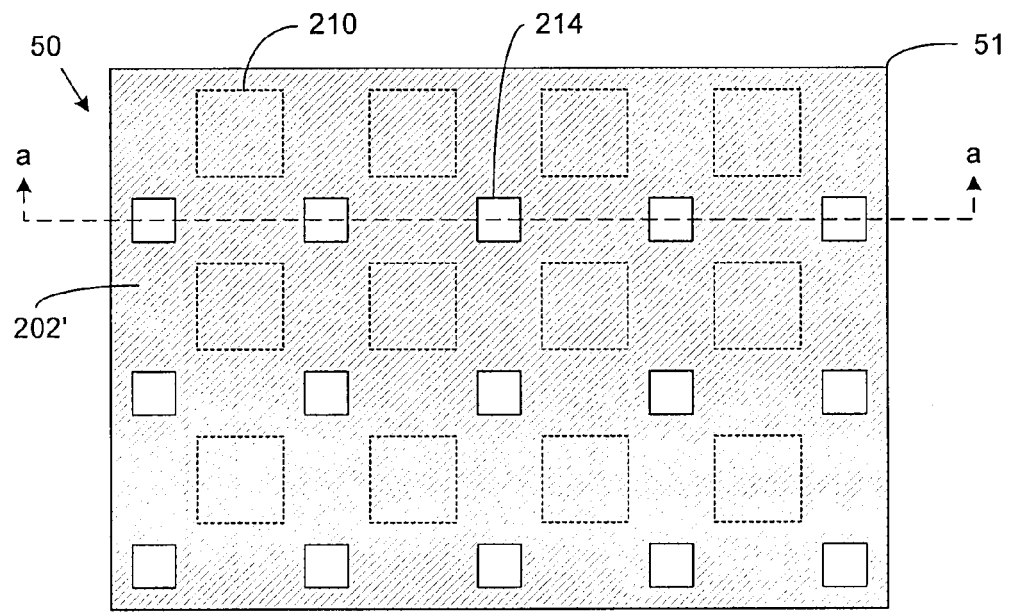
FIG. 6H is a plan view of a portion of the mask of FIG. 6G.

Moving to step 122, the exposed portions 212 of the substrate 51 are etched, thereby forming a second set of trenches 214 in the substrate, as can be seen in FIGS. 6G and 6H. The second trench 214 forms an image of a side lobe suppressor 52 in the photosensitive layer when the CPM 50 is used to pattern an image on a photosensitive layer. As was noted above, the etch depth is a strong function of the wavelength of light used to image the contact hole, as well as the composition of the substrate. Thus, the etch depth should be optimized for the particular wavelength of light, the substrate composition, and the amount of light energy that is to be suppressed. Finally, at step 122 the resist layer 202' is removed from the substrate 51 and the process is complete.

Figure 6I:
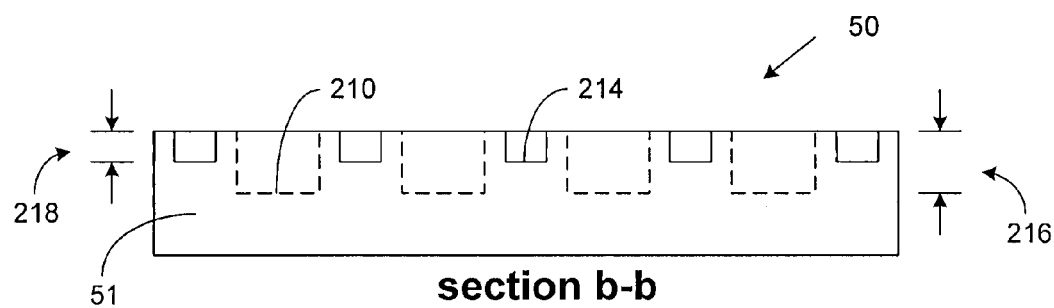
FIG. 6I is a cross section of the mask and pattern described in the flow chart of FIG. 5 in an final stage of fabrication.
Figure 6J:
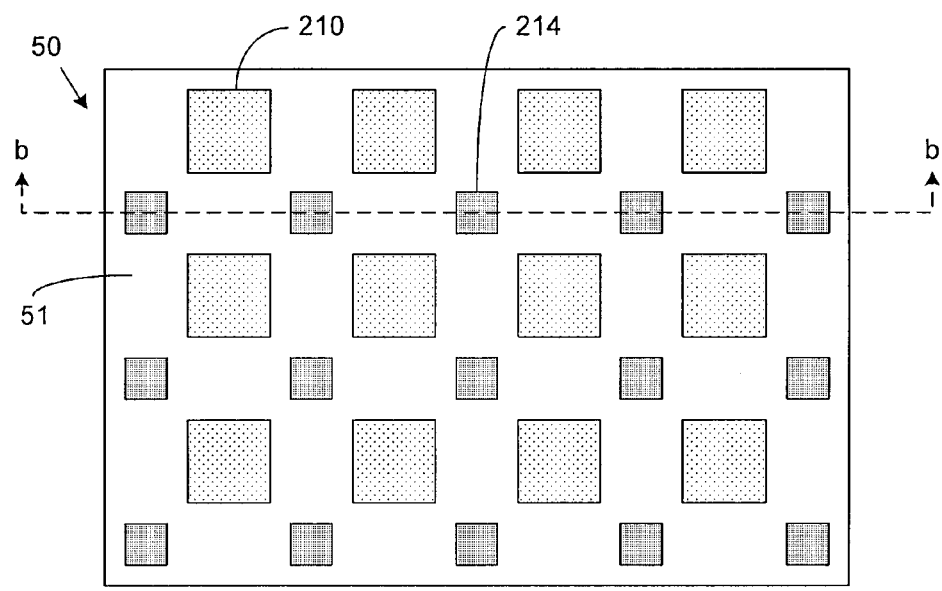
FIG. 6J is a plan view of a portion of the mask of FIG. 6I.

A cross sectional view and a plan view of the CPM 50 are shown in FIGS. 6I and 6J, respectively. FIG. 6I, which is an exaggerated cross-sectional view of the CPM 50, clearly illustrates the difference in the etch depths 216, 218 between the first trench 210 and the second trench 214. Light energy passing through the second trench 214 is phase shifted by a different amount than light energy passing through the first trench 210. This phase difference substantially reduces and/or cancels interference from adjacent and nearby features of the CPM 50 during imaging of the pattern onto a photosensitive layer, thereby permitting smaller features, such as contact holes, to be imaged.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of forming a chromeless phase-shift mask (CPM) for imaging sub-100 nanometer (nm) features, comprising:
    forming a plurality of features on a substrate, said plurality of features defined within a grid pattern that comprises non-phase-shifted regions; and
    forming a plurality of suppressors on the substrate, wherein at least one of the plurality of suppressors is offset from a center point defined by an intersection of two-non-phase-shifted regions of the grid pattern, wherein when the CPM is exposed to light energy, the suppressors substantially reduce an interference generated between features within an optical proximity of each other.

2. The method of claim 1, wherein forming at least one of the plurality of suppressors offset from the center point includes forming all of the plurality of suppressors offset from the center point by a substantially equal distance.

3. The method of claim 1, wherein forming the plurality of features further comprises forming a plurality of rectangular shape features in phase-shifted glass, said plurality of rectangular shape features formed so as to correspond to the grid pattern, said non-phase-shifting regions of the grid pattern comprising a first plurality of strips formed in non-phase-shifted glass and a second plurality of strips formed in non-phase-shifted glass, wherein the first plurality of strips are substantially orthogonal to the second plurality of strips, and the first and second plurality of strips have a width defined as "S".

4. The method of claim 3, wherein forming the plurality of suppressors includes forming at least one of a length and a width of the plurality of suppressors to be less than "S".

5. The method of claim 3, wherein forming the plurality of suppressors includes forming at least one of a length and a width of the plurality of suppressors to be equal to "S".

6. The method of claim 3, wherein forming the plurality of suppressors includes forming at least one of a length and a width of the plurality of suppressors to be greater than "S".

7. The method of claim 3, wherein forming the plurality of rectangular shape features includes forming square shape features.

8. The method of claim 1, wherein forming the plurality of features on the substrate includes of forming a plurality of features that produce an image of a contact hole when exposed to light energy.

9. The method of claim 1, wherein forming the plurality of features on the substrate includes the step using a glass substrate.

10. The method of claim 9, wherein using the glass substrate includes using a quartz substrate.

11. The method of claim 1, wherein forming a plurality of suppressors on the substrate includes forming suppressors that have a rectangular shape.

12. The method of claim 1:
wherein forming the plurality of features on the substrate includes forming the plurality of features in phase-shifted glass; and
wherein forming the plurality of suppressors on the substrate includes forming the plurality of suppressors in phase-shifted glass, wherein when incident light energy passes through the CPM, portions of the light energy are phase-shifted with respect to the incident light energy, and a phase shift introduced by the plurality of features is different from a phase-shift introduced by the plurality of suppressors.

13. The method of claim 1, wherein forming a plurality of features on the substrate includes forming features that include optical proximity correction decorations.

14. The method of claim 1, wherein forming the plurality of features and forming the plurality of suppressors includes introducing a difference of about 60 degrees to about 180 degrees between a phase-shift created by the plurality of features and a phase-shift created by the plurality of suppressors.

15. A chromeless phase-shift mask (CPM) for forming sub-100 nanometer (nm) features on a target surface, comprising:
a substrate;
a plurality of features formed on the substrate and confined within a grid pattern comprising non-phase-shifting regions, said features introducing a first phase-shift to incident light energy passing through the plurality of features; and
a plurality of suppressors formed on the substrate, wherein at least one of the plurality of suppressors is offset from a center point defined by an intersection of two-non-phase-shifted regions of the grid pattern, said suppressors introducing a second phase shift to incident light energy passing through the suppressors, wherein light energy passing through the plurality of suppressors substantially reduces an interference generated by light energy passing through features within an optical proximity of each other.

16. The CPM of claim 15, wherein all of the plurality of suppressors are offset from the center point by substantially an equal distance.

17. The CPM of claim 15, wherein the plurality of features comprise:
a plurality of rectangular shape features formed in phase-shifted glass, said rectangular features being formed so as to correspond to the grid pattern, said non-phase-shifting regions of the grid pattern comprising a first plurality of strips formed in non-phase-shifted glass and a second plurality of strips formed in non-phase-shifted glass, wherein the first plurality of strips are substantially orthogonal to the second plurality of strips, and the first and second plurality of strips have a width defined as "S".

18. The CPM of claim 17, wherein at least one of a length and a width of the plurality of suppressors is less than "S".

19. The CPM of claim 17, wherein at least one of a length and a width of the plurality of suppressors is equal to "S".

20. The CPM of claim 17, wherein at least one of a length and a width of the plurality of suppressors is greater than "S".

21. The CPM of claim 17, wherein the plurality of rectangular shape features are square shape features.

22. The CPM of claim 15, wherein the plurality of features form a contact hole image when the CPM is exposed to light energy.

23. The CPM of claim 15, wherein the substrate is a glass substrate.

24. The CPM of claim 23, wherein the glass substrate is a quartz substrate.

25. The CPM of claim 15, wherein the plurality of features and the plurality of suppressors are formed in phase-shifted glass, and when incident light energy passes through the CPM, a phase shift introduced by the plurality of features is different from a phase-shift introduced by the plurality of suppressors.

26. The CPM of claim 15, wherein the plurality of suppressors on the substrate are rectangular shape suppressors.

27. The CPM of claim 15, wherein the plurality of features on the substrate include optical proximity correction decorations.

28. The CPM of claim 15, wherein a difference between a phase-shift introduced to light energy by the plurality of features and a phase-shift introduced to light energy by the plurality of suppressors is between about 60 degrees to about 180 degrees.

* * * * *